United States Patent [19]

Ohkura et al.

[11] Patent Number: 5,614,471
[45] Date of Patent: Mar. 25, 1997

[54] SUPERCONDUCTIVE MATERIAL

[75] Inventors: Kengo Ohkura; Hajime Hitotsuyanagi; Hiromi Takei, all of Osaka, Japan

[73] Assignee: Sumitomo Electric Industries, Ltd., Japan

[21] Appl. No.: 449,961

[22] Filed: May 25, 1995

Related U.S. Application Data

[63] Continuation of Ser. No. 179,838, Jan. 10, 1994, abandoned, which is a continuation of Ser. No. 681,481, Apr. 3, 1991, abandoned, which is a continuation of Ser. No. 173,686, Mar. 25, 1988, abandoned.

[30] Foreign Application Priority Data

Mar. 30, 1987 [JP] Japan .................................. 62-77237

[51] Int. Cl.$^6$ .................................. C04B 35/505
[52] U.S. Cl. .......................... 505/126; 505/780; 505/778; 505/779; 505/123; 501/151; 501/152; 252/520; 252/521
[58] Field of Search .................................. 501/151, 152; 252/520, 521; 505/780, 126, 778, 779, 123

[56] References Cited

U.S. PATENT DOCUMENTS

| | | | |
|---|---|---|---|
| 4,902,671 | 2/1990 | Koinuma et al. | 505/731 |
| 5,004,725 | 4/1991 | Ovshinsky et al. | 505/1 |
| 5,242,897 | 9/1993 | Wong et al. | 501/151 |

FOREIGN PATENT DOCUMENTS

| | | |
|---|---|---|
| 0283620 | 10/1987 | European Pat. Off. . |
| 0288641 | 11/1987 | European Pat. Off. . |

OTHER PUBLICATIONS

M. K. Wu et al., "Superconductivity at 93 K in a New Mixed–Phase Y–Ba–Cu–O Compound System at Ambient Pressure," Physical Review Letters, vol. 58, No. 9, Mar. 2, 1987.

R. J. Cava et al., "Bulk Superconductivity at 36 K in $La_{1.8}Sr_{0.2}CuO_4$," Physical Review Letters, vol. 58, No. 4, Jan. 26, 1987.

Bednorz et al, "Susceptibility Measurements Support High—$T_c$ Superconductivity in the Ba–La–Cu–O System", Europhys. Lett. 3 (3) pp. 379–385 (1897). Feb. 1.

Tarascon et al, "Superconductivity at 40k in the Oxygen–Deficient Perovskites $La_{2-x} Sr_x CuO_{4-y}$," Science, 235, Mar. 13, 1987, pp. 1373–1376.

Kistenmacher, "Structural basis for enhanced $T_c$ in $YBa_2Cu_3O_yF_x$", Phys. Rev. B 36 (13), Nov. 1, 1987, pp. 7197–7198.

Hor et al, "Superductivity above 90k in the Square–Planar Compound System, $ABa_2Cu_3O_{6+x}$ with A = Y, La, Nd, Sm, Eu, Gd, Ho, Er and Lu", Phys. Rev. Lett., 58 (18), May 4, 1987, pp. 1891–1884.

Physical Review Letters, vol. 58, No. 24, pp. 2579–2581 S.R. Ovshinsky, Jun. 15, 1987.

Tonouchi, M; et al.; "Hall Coefficient of La–Sr–An Oxide Superconductivity Compound", Japanese Journal of Applied Physics, vol. 26, No. 4, Apr. 1987, pp. 519–520.

Politis, C. et al.; "Preparation and Superconductivity Properties of $La_{1.8} Sr_{0.2} A O_4$ and $YBa_2Cu_3O_{6.5}$", Proceedings of Symposium S, 1987 Spring Meeting of the Materials Research Society, Extended Abstracts High Temperature Superconductors Apr. 23–24, 1987 pp. 141–144.

Dagaine R; "Superconductivity: A Revolution in Electricity is Taking Shape"; Chemical and Engineering News May 11, 1987.

(List continued on next page.)

Primary Examiner—Melissa Bonner
Attorney, Agent, or Firm—Pennie & Edmonds

[57] ABSTRACT

A superconductive material is in composition expressed as $Y_{0.33}Ba_{0.67})_a Cu_b(OF)_c$. The usual a, b and c are so selected as to satisfy a relation expression ax (mix valence of A)+bx (mix valence of B)=cx (mix valence of C).

3 Claims, 1 Drawing Sheet

OTHER PUBLICATIONS

Nguyen, N. et al., "Oxygen Defect $K_2NiF_4$–Type Oxides: The Compounds $La_{2-x}Sr_x$ An $O_{4-x/2+\delta}$" no month 1981.

Uchida, S.; "High Tc Superconductivity of La–Ba–Cu Oxides"; Japanese Journal of Applied Physics, vol. 26, No. 1, Jan. 1987, pp. L1–L2.

Takagi, H.; "High Tc Superconductivity of La–Ba–Cu Oxides. II.—Specification of the Superconductivity Phase", Japanese Journal of Applied Physics, vol. 26, No. 2, Feb. 1987, pp. L123–L124.

*Introduction to Ceramics,* W. D. Kingery, Wiley and Sons, 1960, pp. 175–178 no month.

SUPERCONDUCTIVE MATERIAL

This is a continuation of application Ser. No. 08/179,838, filed Jan. 10, 1994, now abandoned, which is a continuation of application Ser. No. 07/681,481, filed Apr. 3, 1991, now abandoned, which is a continuation of application Ser. No. 07/173,686, filed Mar. 25, 1988, now abandoned.

BACKGROUND OF THE INVENTION

1. Field of the Invention

The present invention relates to a novel superconductive material, and more particularly, it relates to a ceramic superconductive material which is employed for a power product to which a superconducting magnet is applied, a Josephson device for a computer or an infrared sensor, etc.

2. Description of the Prior Art

The most significant property of a superconductive material is that the same enters a superconductive state at a higher critical temperature. This is because the obtained critical temperature determines the cooling medium to be employed and the range of practical use.

The critical temperature of a conventional superconductive material has been at about 23K at the best, while a cooling medium therefor has been generally prepared by liquid helium, the temperature of which is sufficiently lower than the critical temperature.

However, such liquid helium is high-priced, while a costly vacuum adiabatic vessel has been inevitably required in order to prevent evaporation thereof.

It has recently been recognized that certain ceramic materials show the superconducting phenomenon. Such a material is prepared by an oxide which is in $K_2NiF_4$ type layer perovskite crystal structure generally expressed in a chemical formula $(A_{1-x}B_x)_2CO_{4-y}$. It has been confirmed that such a material shows a critical temperature of about 40K. However, this material still requires a cooling medium of high-priced liquid helium. On the other hand, an extremely low-priced cooling medium is prepared by liquid nitrogen, which has a boiling point temperature of 77K. Thus, such low-priced liquid nitrogen can be employed in place of liquid helium for a superconductive material having a critical temperature of at least 77K, to extremely widen the range of practical superconduction.

SUMMARY OF THE INVENTION

An object of the present invention is to provide a superconductive material which has a critical temperature higher than 77K.

The present invention provides a ceramics superconductive material which is in composition generally expressed by a formula AaBbCc, where a, b and c are so selected as to satisfy a relational expression ax (mix valence of A)+bx (mix valence of B)=cx (mix valence of C), A represents at least a single element selected from those belonging to the groups Ia, IIa and IIIa of the periodic table, B represents at least a element selected from those belonging to the groups Ib, IIb and IIIb of the periodic table, and C represents a mixture of oxygen and fluorine.

The elements belonging to the group Ia of the periodic table are H, Li, Na, K, Rb, Cs and Fr. The elements belonging to the group IIa of the periodic table are Be, Mg, Ca, Sr, Ba and Ra. The elements belonging to the group IIIa of the periodic table are Sc, Y, La, Ce, Pr, Nd, Pm, Sm, Eu, Gd, Tb, Dy, Ho, Er, Tm, Yb, Lu, Ac, Th, Pa, U, Np, Pu, Am, Cm, Bk, Cf, Es, Fm, Md, No and Lr.

The elements belonging to the group Ib of the periodic table are Cu, Ag and Au. The elements belonging to the group IIb of the periodic table are Zn, Cd and Hg. The elements belonging to the group IIIb of the periodic table are B, Al, Ga, In and Tl.

A superconductive material obtained according to the present invention is expressed in the aforementioned general formula. Such a ceramic superconductive material can be obtained by sintering powder which is mixed to be in prescribed composition, for example. Alternatively, the inventive material can be formed as a thin film by sputtering or CVD.

It has been confirmed that the superconductive material obtained of the aforementioned manner is in layer perovskite structure, and has a high critical temperature which cannot be obtained by a conventional metal superconductive material such as niobium-titanium alloy or niobium-tin alloy.

It has been also confirmed that the superconductive material obtained according to the present invention shows a high critical temperature exceeding the boiling point temperature of 77K of liquid nitrogen.

Further, it is recognized that a most preferable superconductive material showing high critical current is obtained when C in the above chemical formula is expressed as follows:

$$C=(O_{1-z}F_z)[0 \leq z < 0.5]$$

where O represents oxygen and F represents fluorine.

If the value z exceeds 0.5, fluorine is larger in amount than oxygen. Thus, a larger number of electrons contributing to current are captured by fluorine, to reduce the critical current.

As hereinabove described, liquid nitrogen can be employed as the coolant in a system employing the inventive superconductive material. Thus, the cost for the cooling medium can be reduced to about 1/20, while adiabatic structure for a cryovessel is simplified, leading to overall reduction in cost for an apparatus utilizing a superconducting phenomenon.

The present invention is effectively applied to a Josephson computer device through the high-speed property of such an effect, and an infrared sensor of high sensitivity.

These and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 1:
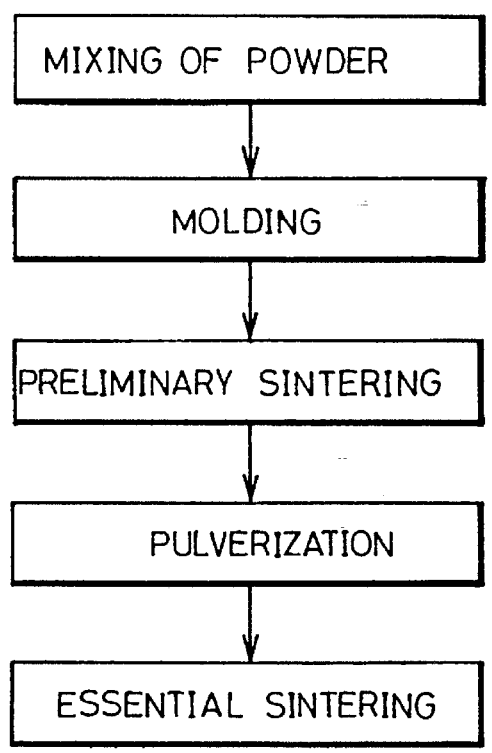
FIG. 1 is a process drawing showing a powder sintering method for obtaining a superconductive material according to the present invention.

$Y_2O_3$, $BaCO_3$, CuO and $CuF_2$ were employed as raw materials and sintered by a general powder sintering method in accordance the steps shown in FIG. 1. The mixing ratio was $Y_2O_3:BaCO_3:(CuO+CuF_2) =1:4:6$, $CuO:CuF_2=1:0.1$ in mole ratio. Preliminary sintering was performed at a temperature of 900° C. for 10 hours. Then essential firing was performed on a cylindrical compact of 10 mm in diameter and 5 mm in thickness at a temperature of 950° C. for two hours.

Figure 2:
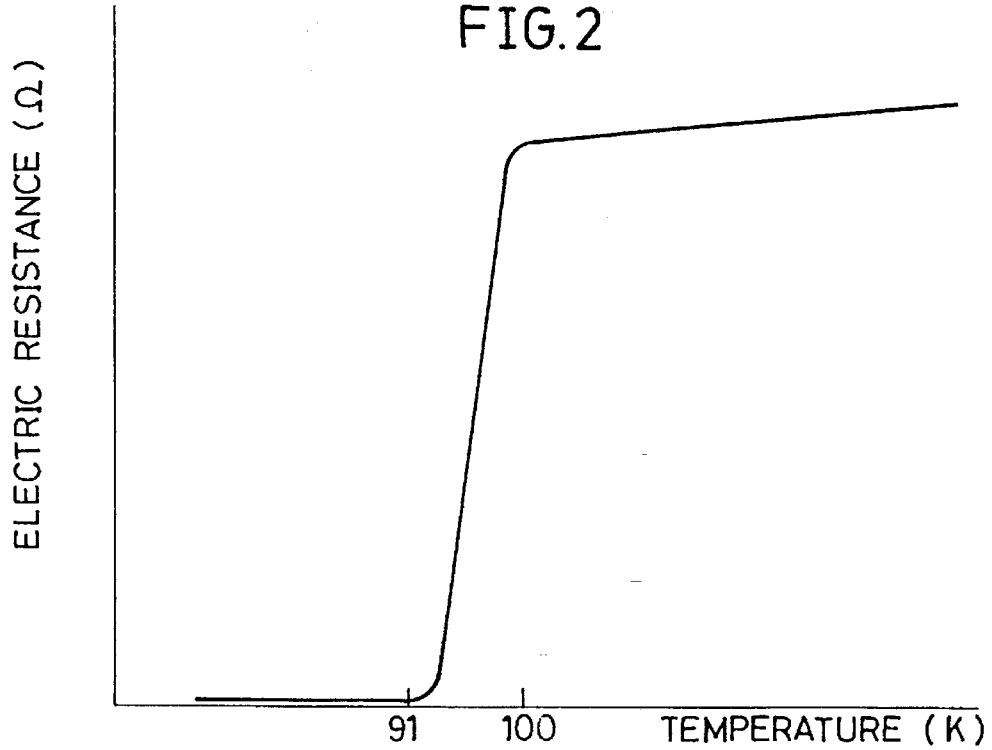
FIG. 2 illustrates electric resistance temperature dependency of the superconductive material according to the present invention.

The cylindrical sample thus obtained was subjected to measurement of a critical temperature in liquid nitrogen by the usual four-terminal method, to obtain electric resistance temperature dependency as shown in FIG. 2. As obvious from FIG. 2, transition from normal conduction to superconduction started at a temperature of 100K, and a superconductive state was attained at a temperature of 91K. It has been confirmed by measurement that the critical current was 1100 A/cm$^2$.

EXAMPLE 2

A target for sputtering was prepared of the essentially sintered material obtained in Example 1. This target was employed for sputtering in an atmosphere obtained by supplying fluorine gas into Ar gas. A thin film could be generated under sputtering conditions of a substrate temperature of 600° C. and Ar gas pressure of 10$^{-1}$ Torr. Thereafter heat treatment was performed on the thin film at a temperature of 900° C. The thin film obtained showed a critical temperature of 85K.

Further, it has been confirmed through measurement that critical current density of the thin film was Jc =150 A/mm$^2$.

EXAMPLE 3

$La_2O_3$, $SrCO_3$, CuO and $CuF_2$ were employed as raw materials and sintered by a general powder sintering method in accordance with the steps of in FIG. 1. The mixing ratio was $La_2O_3:SrCO_3:(CuO+CuF_2) =1.85:0.15:1$, $CuO:CuF_2= 1:0.1$ in mole ratio. Preliminary sintering was performed at a temperature of 900° C. for 10 hours. Then essential firing was performed on a cylindrical compact of 10 mm in diameter and 5 mm in thickness at a temperature of 950° C. for two hours.

The cylindrical sample thus obtained was subjected to measurement of a critical temperature in liquid nitrogen by a general four-terminal method, to obtain electric by the usual four-terminal method. The transition from normal conduction to superconduction started at a temperature of 35K, and a superconductive state was attained at a temperature of 32K. It has been confirmed by measurement that the critical current was 1100 A/cm$^2$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A superconductive material having a general formula of $$YBa_2Cu_3(O_{0.9}F_{0.1})_c$$

wherein Y is a rare earth element.

2. A superconductive material having a general formula of $$La_{1.85}Sr_{0.15}Cu(O_{0.9}F_{0.1})_c.$$

3. A method for making a superconductive material having a general formula of $La_{1.85}Sr_{0.15}Cu(O_{0.0}F_{0.1})_c$ or $YBa_2Cu_3(O_{0.9}F_{0.1})_c$ wherein Y is a rare earth element, comprising the steps of mixing materials comprising La and Sr or Y and Ba with materials comprising Cu, O and F, wherein O and F has a ratio expressed by $O_{0.9}F_{0.1}$; and sintering the materials to form the superconductive material.

* * * * *